United States Patent
Sato

(10) Patent No.: US 6,303,499 B1
(45) Date of Patent: Oct. 16, 2001

(54) PROCESS FOR PREPARING SEMICONDUCTOR DEVICE

(75) Inventor: Yasue Sato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/479,855

(22) Filed: Jun. 7, 1995

Related U.S. Application Data

(63) Continuation of application No. 07/709,199, filed on Jun. 3, 1991, now abandoned.

(30) Foreign Application Priority Data

Jun. 1, 1990 (JP) .................................................. 2-144611

(51) Int. Cl.$^7$ .................................................. H01L 21/44
(52) U.S. Cl. .......................... 438/676; 438/677; 438/771; 438/792
(58) Field of Search .................................... 437/173, 174, 437/19, 930; 148/DIG. 93; 427/255.2, 582, 583, 584; 438/676, 677, 771, 792

(56) References Cited

U.S. PATENT DOCUMENTS

| | | | |
|---|---|---|---|
| 4,339,285 | * 7/1982 | Pankove | 437/19 |
| 4,558,660 | * 12/1985 | Nishizawa et al. | 118/725 |
| 4,595,601 | 6/1986 | Horioka et al. . | |
| 4,608,117 | * 8/1986 | Ehrlich et al. | 148/DIG. 93 |
| 4,653,428 | * 3/1987 | Wilson et al. | 118/725 |
| 4,785,962 | * 11/1988 | Toshima | 220/260 |
| 4,940,505 | * 7/1990 | Schachameyer et al. | 156/612 |
| 4,957,880 | * 9/1990 | Itoh et al. | 437/192 |
| 5,026,664 | * 6/1991 | Hongo et al. | 437/189 |
| 5,091,210 | * 2/1992 | Mikoshiba et al. | 427/39 |
| 5,179,042 | * 1/1993 | Mikoshiba et al. | 437/187 |

FOREIGN PATENT DOCUMENTS

| | | | |
|---|---|---|---|
| 0420594 | * 4/1991 | (EP) | 437/198 |
| 63-33569 | 2/1988 | (JP) . | |
| 1-161174 | * 6/1989 | (JP) | 427/255.2 |
| 8606756 | 11/1986 | (WO) . | |

OTHER PUBLICATIONS

Orlowski, T., et al., "Ultra fast laser–induced . . . ", Appl. Phys. Lett., vol. 45, No. 3, Aug. 1, 1984, pp. 241–243.*
Boyer, P., et al., "Laser photodeposition . . . ", Conf. Electrochemical Soc., Spring Meeting May 1982, pp. 102–103.*
Wolf, et al., Silicon Procening, vol. 1, 1986, Laltice Press, pp. 182–195, pp. 74–75.*
Shigeeda, N., "Selective and NonSelective deposition of aluminum by LPCVD" Rec. Electr. Commu. Eng.*
Conversazione Tokobu Univ. (Japan) vol. 58, No. 4, May 1990, pp. 27–28.*
Thin Solid Films, vol. 45, 1977, pp. 257–263, H.O. Pierson, "Aluminum Coatings By The Decomposition of Alkyls".
Japanese Journal of Applied Physics, vol. 27, No. 8, Aug. 1988, pp. 1392–1394, M. Hanabusa et al., "Photochemical Vapor Deposition of Aluminum Thin Films Using Dimethylaluminum Hydride".
Journal of the Electrochemical Society, vol. 131, No. 9, Sep. 1984, R. A. Levy, et al., "Characterization of LPCVD Aluminum for VLSI Processing", pp. 2175–2182.

* cited by examiner

Primary Examiner—T. N. Quach
(74) Attorney, Agent, or Firm—Fitzpatrick, Cella, Harper & Scinto

(57) ABSTRACT

A process for preparing a semiconductor device includes a step of surface-modifying a desired portion of the surface of a substrate carried out in an atmosphere containing oxygen or nitrogen atoms. The process also includes a step of depositing selectively a metal on an electron-donative surface provided corresponding to the desired portion.

3 Claims, 9 Drawing Sheets

PROCESS FOR PREPARING SEMICONDUCTOR DEVICE

This application is a continuation of application Ser. No. 07/709,199 filed Jun. 3, 1991, abandoned.

BACKGROUND OF THE INVENTION

1. Field of the Invention

This invention relates to a process for preparing a device utilizing a semiconductor to be mounted on various electronic instruments, namely a semiconductor device such as a memory, photoelectric converting device, display device, signal processing device, etc.

2. Related Background Art

The main preparation steps of a semiconductor device are the steps of forming a film of a metal, semiconductor, insulator, etc. on a substrate, and finely working the film to a desired pattern.

In recent years, as represented by a semiconductor memory device (memory), larger capacity and higher performances of functions of the device have rapidly advanced and, accompanied therewith, the circuit pattern has become finer and the circuit structure more complicated. On the other hand, a display device such as a liquid crystal display, plasma display, etc. is becoming increasingly larger, and the device function also more complicated. Accordingly, the film forming step and the etching step for performing fine working are steps using a solution or carried out in vacuum and now primarily the so called dry steps by use of plasma or excited gas in reduced pressure gas are used. However, in the photolithographic process generally used for performing a desired fine working, complicated and cumbersome processes such as resist coating, pattern exposure, developing, etching, resist peel off, etc. are employed. Among them, since solutions are employed in the resist coating, developing and resist peel off steps, they cannot be made dry processes. Also, a washing step and drying step after the solution treatment accompanying these steps are required, whereby the steps are increased. Further, since a resist is employed, the resist is peeled off, which increases the generation of dust, whereby deterioration of device performance and lowering of yield will be brought about to increase the cost as a whole.

For example, for formation of Al to be used primarily as the material for the electrode or wiring of the device, there has been employed a method in which Al film is deposited on the whole surface followed by etching to work it into a desired pattern. As the deposition method of Al film, there has been used a sputtering method such as magnetron sputtering in the prior art. Because, generally speaking, the sputtering method is a the physical deposition method based on scattering of the particles sputtered from the target in vacuum, the film thickness at the stepped portion and the insulating film side wall becomes extremely thin, even being broken in an extreme case. Such nonuniform film thickness or breaking is the main cause for markedly lowering the reliability of LSI.

For overcoming the problems as described above, various types of CVD (Chemical Vapor Deposition) methods have been proposed. In these methods, the chemical reaction of the starting gas in some form is utilized in the film forming process. This is caused by the occurrence of decomposition of the starting gas in plasma CVD or optical CVD in the gas phase, and the active species formed there further react on the substrate to effect film formation.

In these CVD methods, the reaction occurs in the gas phase, and therefore surface coverage on the substrate surface is more even as compared with the sputtering method, but carbon atoms contained in the starting gas molecules may be incorporated into the film and also particularly in the plasma CVD, as in the case of the sputtering method, there is damage from charged particles (so called plasma damage).

In the hot CVD method, the film grows primarily through the surface reaction on the substrate surface, and therefore the surface coverage is good even over an unevenness such as a stepped difference on the surface. For this reason, wire breaking at the stepped portion can be avoided. Also, there is no charged particle damage as in plasma CVD or the sputtering method. For this reason, as the method for forming Al film, hot CVD methods have been variously studied.

For example, in the example seen in the Journal of Electrochemical Society Vol. 131, p. 2175 (1984), by use of triisobutyl aluminum $\{(i-C_4H_9)_3Al\}$ (TIBA) as the organic aluminum gas, a film with a 3.4 $\mu\Omega$·cm is formed by film formation under the conditions of a film forming temperature of 260° C. and a reaction tube pressure of 0.5 Torr. When TIBA is employed, no continuous film can be obtained, unless a treatment such as flowing of $TiCl_4$ to activate the substrate surface and form a nucleus is performed before film formation. Also, including the case of employing $TiCl_4$, the surface flatness is generally poor when TIBA is employed.

Japanese Laid-Open Patent Application No. 63-33569 discloses a method of forming a film by heating an organic aluminum in the vicinity of the substrate without use of $TiCl_4$. In this case, the step of removing the naturally oxidized film on the substrate surface is required.

Since TIBA can be used alone, no carrier gas other than TIBA is required to be used, but it is described in the application that Ar gas may be also used as the carrier gas. However, no reaction of TIBA with other gases (e.g. $H_2$) is contemplated at all. This is because it is difficult to predict what kind of organic metal should be used and how it should be deposited, because the chemical properties of organic metals generally vary greatly when the organic substituent varies even a very little.

In etching of Al, after-corrosion occurs, namely corrosion of aluminum by generation of HCl through the reaction of $Cl_2$ or the reaction product ($AlCl_3$, etc.) attached during etching by use of the chlorine type ($Cl_2$, $CCl_4$, etc.) gas with a moisture remaining in the air or the etching chamber occurs, thereby causing a great deal of breaking of wiring and electrodes.

On the other hand, separately from these techniques, there is the method of irradiating selectively light onto the substrate surface according to the optical CVD method, thereby causing a photochemical reaction to occur only at the irradiated surface to effect selectively deposition, but it is impossible to completely avoid the occurrence of a reaction in the gas phase, and deposition cannot but occur also at other portions than the irradiated site. Also, the deposition speed of optical CVD method is generally slow, and the deposition speed is smaller by about one power of 10 as compared with the hot CVD method.

Thus, as described above, in the steps of the prior art, there remains much room for improvement corresponding to further higher integration and performances of semiconductor devices.

SUMMARY OF THE INVENTION

The present invention has been accomplished in view of the technical task as described above, and its object is to provide a process for preparing a semiconductor device which can deposit a metal of high quality as the electroconductor with high selectivity and good yield without use of a resist.

It is also another object of the present invention to provide a process for preparing a semiconductor which can selectivity form an electrode or wiring by varying the electron donative characteristics of the surface by forming a light latent image film.

Still another object of the present invention is to provide a process for preparing a semiconductor which can form a metal film of good quality with required generation of dust and also improve yield according to simplified steps, because of using no resist.

Still another object of the present invention is to provide a process for preparing a semiconductor which enables also a consistent process of semiconductor device in vacuum and also without contact with air, whereby a semiconductor device of high performance can be prepared, and reliability of the device can be improved without generation of after-corrosion, because there is no etching step.

Still another object of the present invention is to provide a process for preparing a semiconductor device, having the step of surface modifying a desired site of the surface of a substrate and the step of depositing selectively a metal on an electron donative surface provided corresponding to the site.

DETAILED DESCRIPTION OF THE PREFERRED EMBODIMENTS

Figure 1:
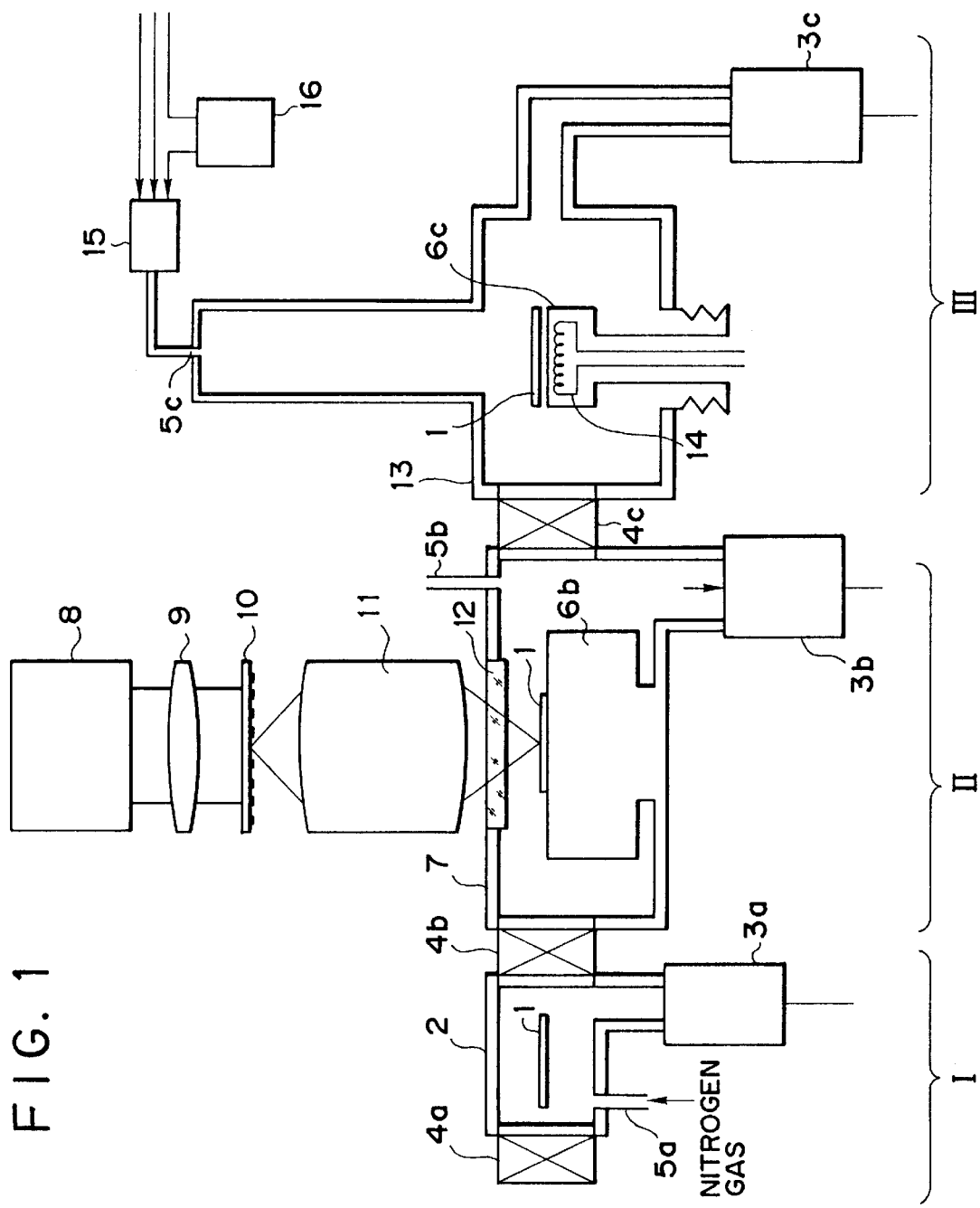
FIG. 1 and FIG. 2 are schematic views for illustration of an example of the apparatus for practicing the present invention.

In the present invention, a semiconductor device is prepared by modifying the desired site of the substrate surface by, for example, selective photoirradiation and selective deposition of a metal on the electron donative surface corresponding to the site.

More specifically, in the present invention, the substrate surface comprising a semiconductor, metal or insulator formed thereon is subjected to surface modification, for example, irradiation of a light selectively to the substrate surface in a reactive gas atmosphere to modify photochemically the irradiated surface (latent image layer formation), thereby changing the surface to the electron donative surface or the non-electron-donative surface, whereby a film of good quality is formed only on the electron-donative surface by selective deposition to form an electrode or wiring.

Therefore, an electrode or wiring can be formed without using resist at all and the steps can be simplified. Also, there will be no generation of dust by the resist peeled off, and because no etching step is required, no after-corrosion will be generated to improve the performances and yield of the device.

Further, by forming a film by use of the hot CVD method utilizing an alkylaluminum hydride and hydrogen, a film with good quality as well as good surface coverage can be deposited at high speed.

Preferred embodiments of the present invention are described below by referring to the drawings.

First, an example of preferable semiconductor preparation apparatus to which the present invention is applied is described.

The semiconductor preparation apparatus shown in FIG. 1 is generally constituted of the loadlock part I, the light latent image forming part II, the Al selective deposition part III, which are mutually connected to each other through the gate valves 4a, 4b and 4c. In FIG. 1, the reference character 1 is the substrate, 2 the loadlock chamber for returning the substrate 1 under vacuum atmosphere or atmospheric atmosphere, 3a, 3b and 3c are the vacuum evacuation systems constituted of turbo molecular pump, rotary pump, etc., 4a, 4b and 4c the gate valves which can take in and out the substrate 1 capable of making the respective chambers vacuum air tight, 5a, 5b and 5c the gas introducing inlets for introducing gases, 6b and 6c the substrate holders for mounting the substrate 1 thereon, 7 is the latent image chamber for formation of latent image layer, 8 the laser oscillator or lamp which is the light source, 9 the illumination optical system for irradiation of the mask (or reticle) 10 patterned with a light-shielding material, 11 the projection optical system for focusing the mask pattern on the surface of the substrate 1, 12 the window for introducing the light emitted from the projection optical system 11 into the latent image chamber 7, 13 the Al selective deposition chamber for depositing selectively Al at the electron-donative portion formed on the substrate surface, 14 the heater located in the substrate holder 6c for heating the substrate 1, 15 the gas mixer for feeding the mixture of the starting gas and the reactive gas into the Al selective deposition chamber 13, 16 the starting gas gasifier for gasifying an organic metal as the starting gas.

Next, the outline of the preparation process is described.

In FIG. 1, the substrate 1 with cleaned surface is placed in the loadlock chamber 2 for introducing it into vacuum atmosphere, the loadlock chamber 2 is vacuum evacuated by the vacuum evacuation system 3a, the gate valve 4b is opened and the substrate is mounted on the substrate holder 6a with in the latent image chamber. The light generated from the light source is irradiated uniformly to the mask 10 for formation of a desired pattern by the illumination optical system 9, and the pattern image of the mask 9 is focused through the window 12 onto the surface of the substrate 1 according to the projection optical system 11. The mask 10 has the portion which transmits the above light and the portion which is non-transmissive or little in amount of the light transmitted, and forms a pattern with these portions. The material for the window is suitably selected depending on the wavelength of the light source employed from window materials which do not absorb but transmit the wavelength. The latent image chamber 7 is internally vacuum evacuated by the vacuum evacuation system 3b, and a gas for effecting photochemical change of the surface is introduced through the gas introducing inlet 5b.

As the gas, for example, if the surface is desired to be oxidized, it may be treated in an atmosphere containing oxygen atoms, and for example, $O_2$, $O_3$ or $NO_2$ gas may be employed, while if it is desired to be nitrified, it may be treated in an atmosphere containing nitrogen atoms (containing substantially no oxygen atom), and for example, $N_2$, $NH_3$ gas may be preferably employed.

By introducing the surface modification step according to the photochemical reaction (e.g. oxidation, nitrification, reduction) only at the portion of the substrate 1 irradiated with the light by introduction of such gas, a latent image layer with a thickness of about 50 to 100 Å formed of an oxide film or a nitride film, etc. is formed on the surface, thereby forming selectively the electron donative surface or the non-electron-donative surface. For example, by selective oxidation or nitrification of the surface of a metal or semiconductor, the metal surface can be made selectively non-electron donative. On the other hand, by selective reduction of the surface of an oxide film or nitride film of a metal or semiconductor, the portion can be made electron-donative.

Particularly, it is better in reproducibility to make a nitride film electron donative, whereby a film of good quality can be deposited.

Here, the wavelength of the light causing the photoreaction to occur may be suitably chosen depending on the material of the substrate and the kind of the gas. For example, for formation of the latent image layer of an oxide film on the Si substrate, $O_2$, $O_3$ or $NO_2$ gas can be employed, and as the light source, various excimer lasers such as KrF, ArF, XeCl, $F_2$ laser, dyestuff laser, lamp light sources such as deuterium lamp, low pressure mercury lamp, etc. can be employed.

Figure 2:
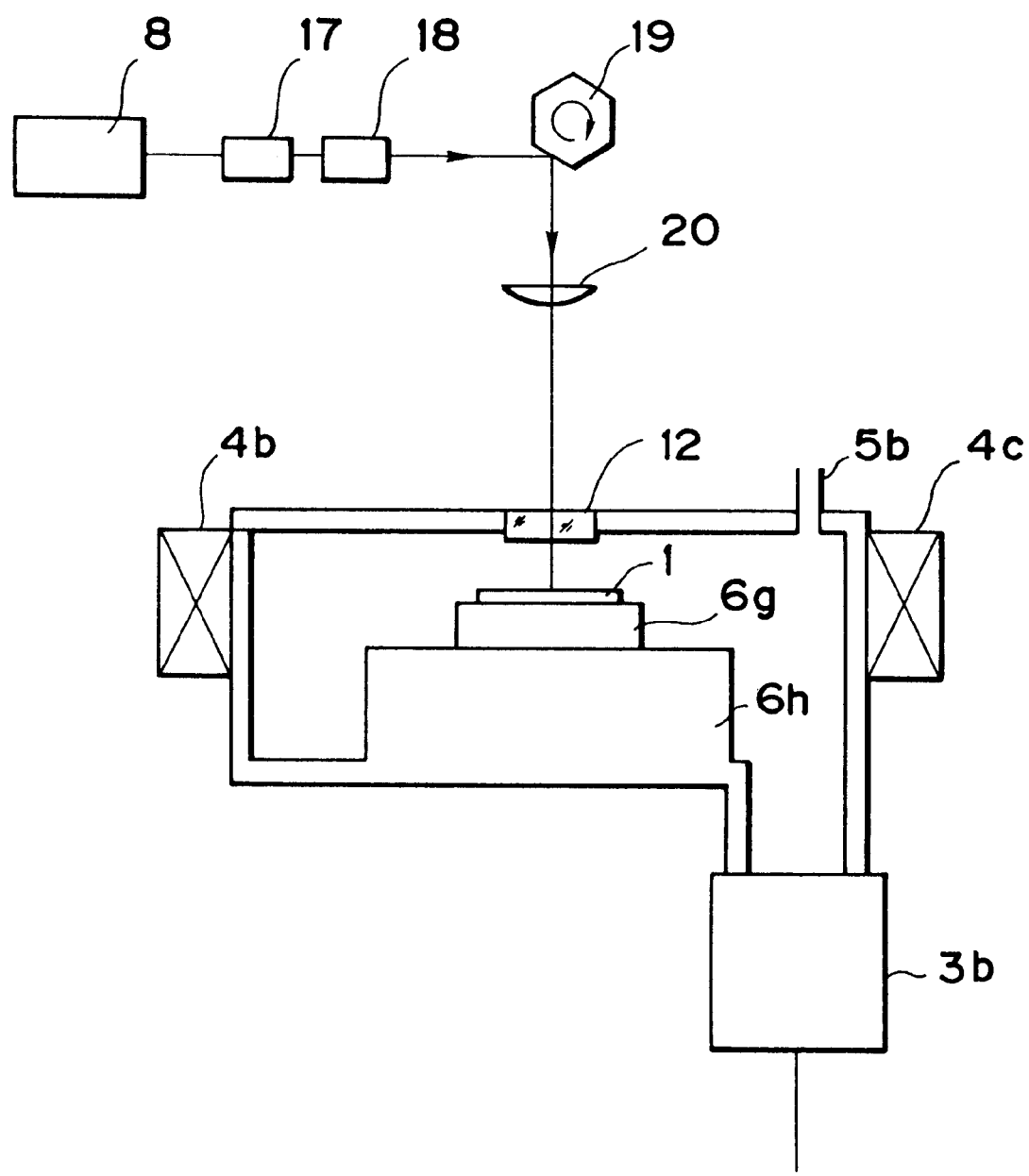

As a method for irradiating selectively light, there is the method by use of the projection exposure apparatus shown in FIG. 1 and the method by use of the direct drawing apparatus with laser beam shown in FIG. 2.

In FIG. 2, 17 is the light modulator, 18 the collimator lens, 19 the rotatory polyhedral mirror, 20 the f-θ lens, 6g the substrate holder mounted on the stage 6h which can be moved in the direction perpendicular to the scanning direction of the laser beam, and otherwise the same constitutions as shown in FIG. 1 are attached with the same reference characters. In FIG. 2, the laser beam oscillated from the laser which is the light source (preferably continuous light in this case) is modulated so that a desired pattern can be formed by the light modulator, scanned in one-dimensional direction by the rotatory polyhedron 19, and focused onto the substrate surface by the collimator lens 18 and the f-θ lens 20. Also, by moving the substrate holder in the direction perpendicular to the scanning direction of the laser beam, the light can be selectively irradiated to the whole substrate surface.

As the laser beam of the light source, any one which can effect the photochemical reaction of the surface may be employed. For example, as the light source for forming the latent image of an oxide film on the GaAs substrate, in addition to the lasers as described above, Ar laser, krypton laser, He—Cd laser is preferably used. For formation of a latent image by reduction of the Si film formed by cleavage of the Si—N bond on the SiN film surface formed on the Si substrate, it is preferable to use $NH_3$ laser excited with $CO_2$ laser, etc.

Next, the substrate 1 is mounted on the substrate holder 6c in the Al selective deposition chamber 13 vacuum evacuated by the vacuum evacuation system 3c, and the step of depositing selectively Al thereon is performed. In this step, particularly as the CVD method which deposits selectively a metal film composed of a metal film of good quality composed of Al or mainly of Al as the electroconductive deposition film, it is preferable to use the CVD method by use of an alkyl aluminum hydride and hydrogen (hereinafter called the Al-CVD method).

The Al-CVD method is the method which can deposit a metal composed of Al or mainly of Al with good quality on the electron donative surface.

The material for forming the electron-donative surface refers to one in which free electrons exist or intentionally formed within the substrate, for example, a material having the surface on which the chemical reaction is promoted by electron donation and acceptance with the starting gas molecules attached on the substrate surface. For example, metals and semiconductors correspond to such materials. Also, those having thin oxide films on the surface of metals or semiconductors are included. This is because the chemical reaction occurs through electron donation and acceptance between the substrate and the adhered starting material molecules.

Specifically, there may be included semiconductors such as monocrystalline silicon, polycrystalline silicon, amorphous silicon, etc.; binary system, ternary system or quaternary system III–V group compound semiconductors comprising combinations of Ga, In, Al as the group III element and P, As, N as the group V element; metals, alloys and silicides thereof such as tungsten, molybdenum, tantalumn, tungsten silicide, titanium silicide, aluminum, aluminum silicon, titanium aluminum, titanium nitride, copper, aluminum silicon copper, aluminum palladium, titanium, molybdenum silicide, tantalum silicide, etc.

For the substrate with such constitution, Al is deposited through only the simple thermal reaction in the reaction system of the starting gas and $H_2$. For example, the thermal reaction in the reaction system of dimethylaluminum hydride (DMAH) and $H_2$ may be considered to be basically as follows:

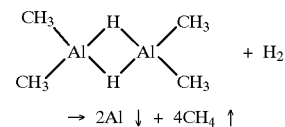

$$\rightarrow 2Al \downarrow + 4CH_4 \uparrow$$

DMAH takes a dimer structure at room temperature. Also with monomethylaluminum hydride ($MMAH_2$), high quality Al could be deposited through the thermal reaction as shown below in Examples.

$MMAH_2$ has a low vapor pressure at room temperature of 0.01 to 0.1 Torr, and therefore a large amount of starting material can be transported with difficulty, and the upper limit value of the deposition speed is some hundred Å/min. in the present invention, and preferably it is most desirable to use DMAH having a vapor pressure of 1 Torr at room temperature.

First, the substrate is heated by the heater 4 to the temperature at which the starting gas can be decomposed or higher and desirably lower than 450° C., more desirably a substrate temperature of 260 to 440° C. When deposition is carried out under this condition, when the DMAH partial pressure is $10^{-4}$ to 10 Torr, the deposition speed is very large as 100 Å/min. to 800 Å/min., to give a sufficiently large deposition speed as the Al deposition technique for ultra-LSI.

More preferably, the substrate temperature may be 270° C. to 350° C., and the Al film deposited under this condition has also strong orientatability, and also even when subjected to heat treatment at 450° C. for one hour, an Al film of good quality without generation of hillock, spike can be obtained on the Si monocrystalline or Si polycrystalline substrate. Also, such Al film is excellent in electromigration resistance.

Next, in the gas producing chamber 16 for producing the starting gas, for the liquid DMAH maintained at room temperature, bubbling is effected with $H_2$ or Ar (or other inert gas) as the carrier gas, to produce gaseous DMAH, which is transported to the mixer 15. $H_2$ as the reaction gas is fed via separate route to the mixer 15. The flow rate is controlled, and the vacuum evacuation system 3c is controlled so that the total pressure may become a desired constant pressure ($10^{-3}$ to 760 Torr).

Thus, the starting gas and the reaction gas are allowed to react thermally on the heated substrate surface, whereby the Al is selectively deposited only on the surface other than the non-electro-donative surface formed in the previous step, or only on the electron donative surface formed in the whole step. The Al deposited film thus formed has a resistivity of 2.7 to 3.0 $\mu\Omega\cdot$cm with a film thickness of 400 Å, which is substantially equal to the resistivity of Al bulk, and becomes a continuous and flat film. At this time, the pressure during film formation can be chosen within the range of $10^{-3}$ Torr to 760 Torr. Also even with a film thickness of 1 $\mu$m, its resistivity is also approximately 2.7 to 3.0 $\mu\Omega\cdot$cm at room temperature, and a sufficiently dense film can be formed also for a thick film. The reflectance in the visible light wavelength region is approximately 80%, and a thin film excellent in surface flatness can be deposited.

As described above, the film obtained according to the Al film formation process based on the present invention is dense, contains little amount of impurities such as carbon, etc., has a resistivity equal to the bulk and also has the characteristic of high surface smoothness, and therefore the following remarkable effects can be obtained.

(1) Reduction of Hillock

Hillock is occurrence of convexities on the Al surface by partial migration of Al when the internal stress is released in the heat treatment step during film formation. Also, similar phenomenon will occur through the local migration by current passage. The Al film formed by the present invention has little internal stress and also under the state approximate to monocrystal. For this reason, while hillocks of $10^4$ to $10^6/cm^2$ are formed in the Al film of the prior art by heat treatment at 450° C. for one hour, the hillock number according to the present invention could be reduced greatly to 0 to $10/cm^2$. Thus, because of substantial absence of the surface convexities, the resist film interlayer insulating film can be made thinner, which is advantageous in making the film finer and more flat.

(2) Improvement of Electromigration Resistance

Electromigration is the phenomenon in which the wiring atoms move by the flow of high density current. By this phenomenon, voids are caused to be generated and grown along the grain boundary, and the wiring generates heat to be broken accompanied with the reduction of sectional area caused thereby.

Migration resistance is generally evaluated in terms of average wiring life.

The wiring of the prior art as described above had an average wiring life of $1\times10^2$ to $10^3$ hours (in the case of wiring sectional area of 1 $\mu m^2$) under the conditions of the current passage test of $1\times10^6$ A/$cm^2$ at 250° C. In contrast, the Al film obtained according to the Al film forming process based on the present invention had an average wiring life of $10^3$ to $10^4$ hours for wiring with a sectional area of 1 $\mu m^2$.

Hence, according to the present invention, for example, when the wiring width is 0.8 $\mu$m, the wiring can sufficiently stand practical application even with a wiring layer thickness of 0.3 $\mu$m. In other words, since the wiring layer thickness can be made smaller, the unevenness on the semiconductor surface after location of the wiring could be suppressed minimum, and also high reliability could be obtained in flowing of ordinary current. Also, this can be rendered possible by a very simple process.

(3) Improvement of Surface Smoothness

As described in detail above, by applying the present invention to the wiring formation method of a semiconductor integrated circuit, it becomes possible to improve the yield to great extent as compared with the Al wiring of the prior art, and promote lowering in cost.

As described above, photographic process and etching process by use of a resist are not required, whereby the yield can be improved to great extent.

Here, as a preferable example, the steps were proceeded continuously by connecting the light latent image forming part II and the Al selective deposition part III through the gate valve as shown in FIG. 1, but they can be also independent of each other.

Generally, the photolithographic process by use of a resist cannot be practiced in vacuum and therefore it has been impossible in the prior art to practice all of the device preparation steps in vacuum, but by applying the process of the present invention and using the semiconductor preparation apparatus as described above, the vacuum consistent process is rendered possible.

The present invention is described in more detail by referring to FIG. 3 to FIG. 8.

Figure 3:
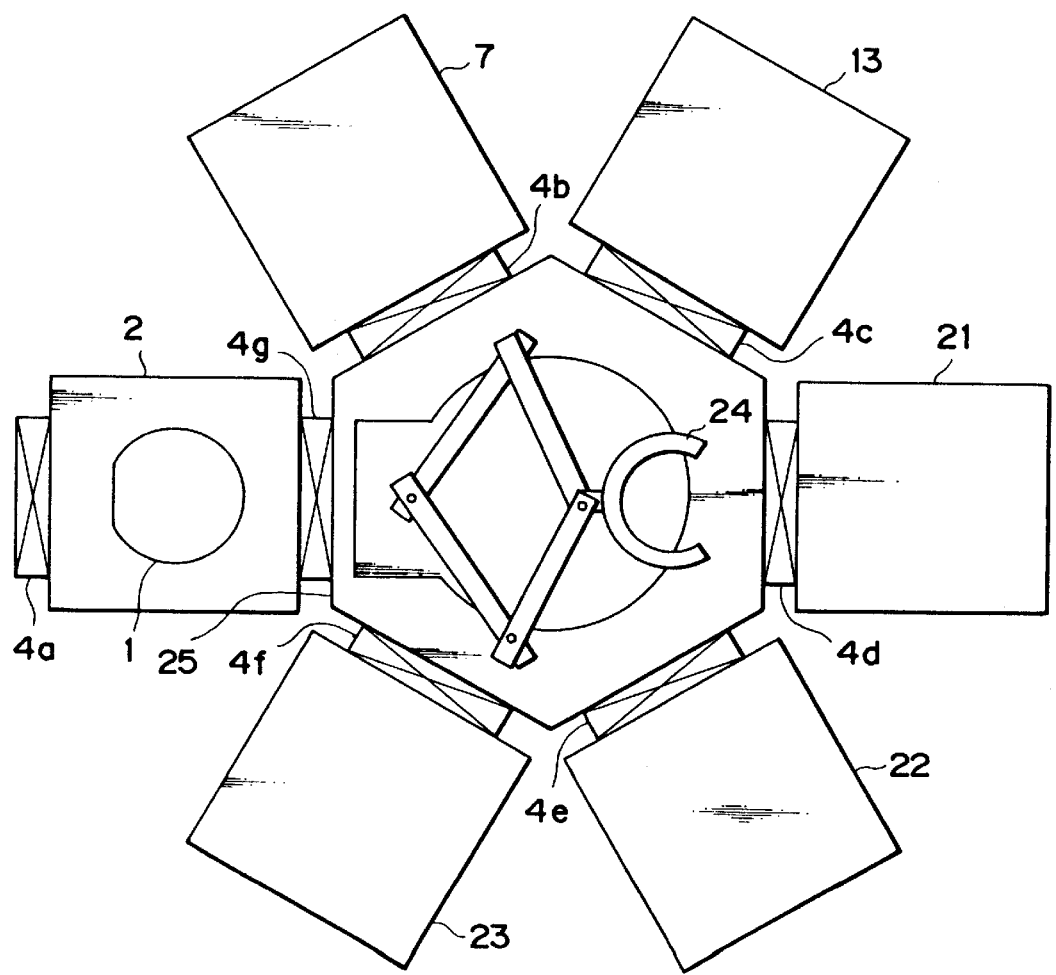
FIG. 3 is an illustration showing an example of the schematic arrangement of the principal parts of the apparatus in which the present application is applied to the vacuum consistent process.
Figure 4:
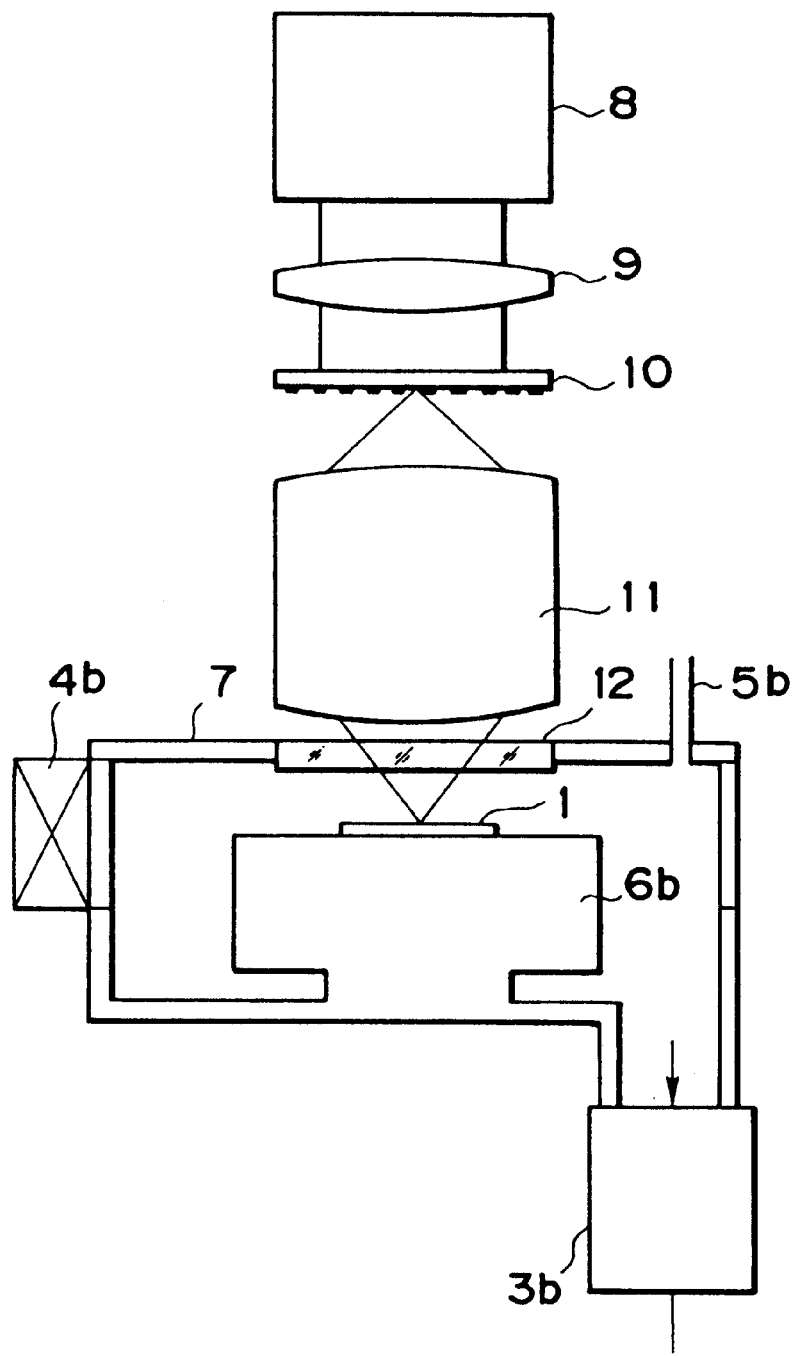
FIG. 4 is a sectional view showing schematically the latent image chamber.
Figure 5:
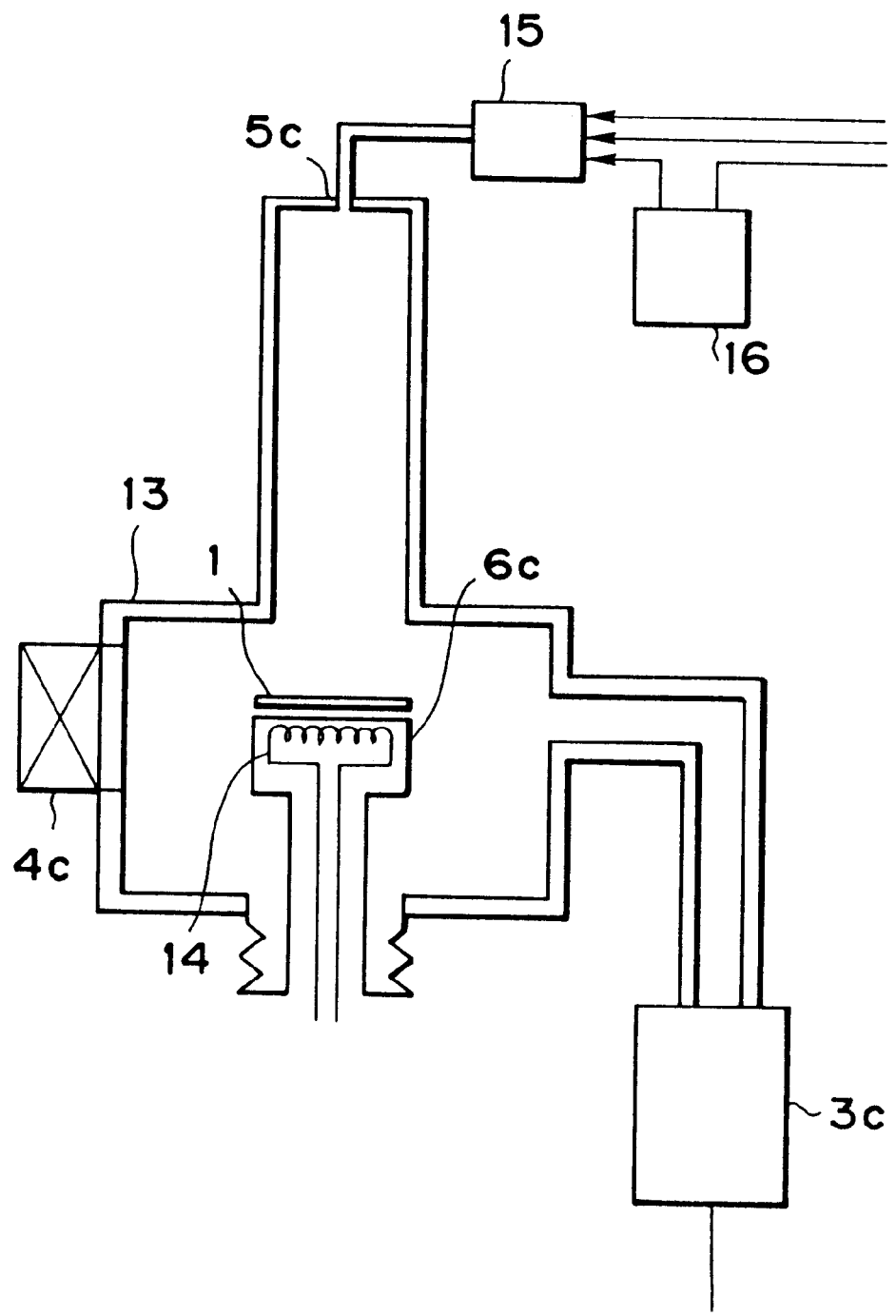
FIG. 5 is a sectional view showing schematically the Al selective deposition chamber.
Figure 6:
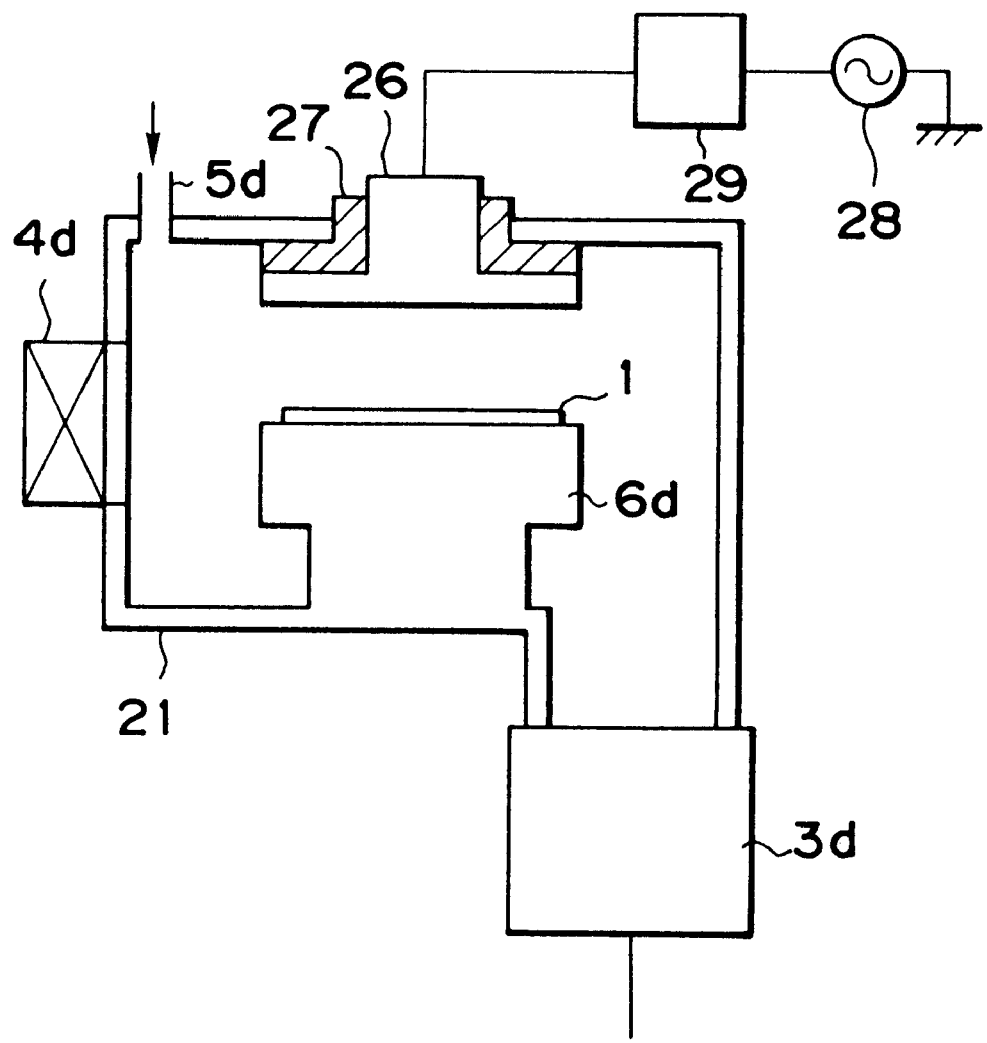
FIG. 6 is a sectional view showing plasma film forming chamber.
Figure 7:
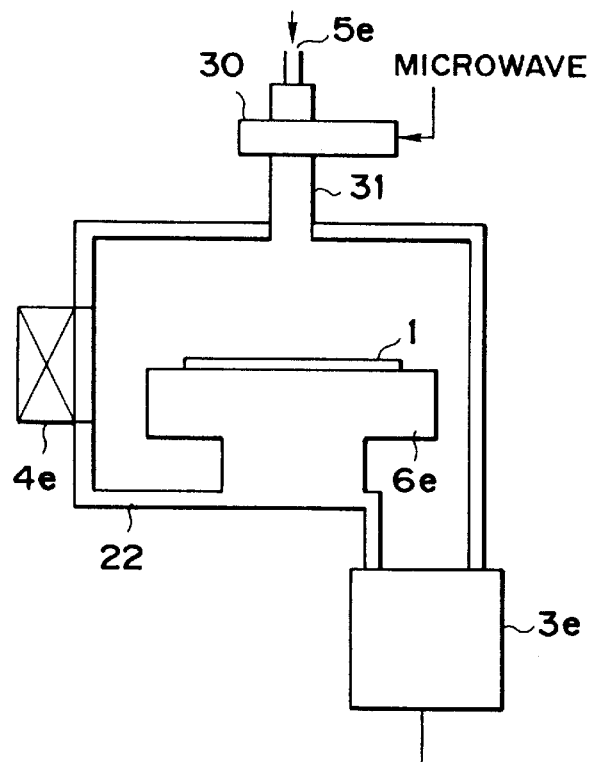
FIG. 7 is a sectional view showing schematically the etching chamber.
Figure 8:
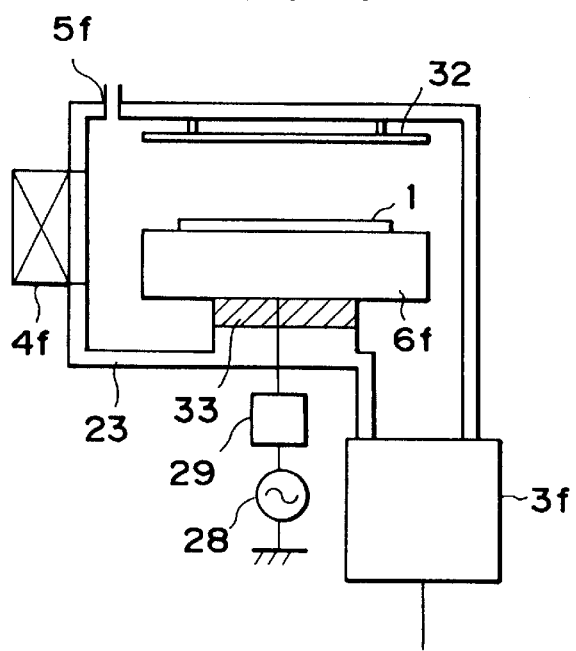
FIG. 8 is a sectional view showing schematically the cleaning chamber.

FIG. 3 is a whole schematic diagram of the present apparatus, namely the vacuum consistent process apparatus. 21 is the plasma film forming chamber which can be made vacuum air tight for plasma film formation of the insulating film and the semiconductor film, 22 the etching chamber which can be made vacuum air tight, 23 the cleaning chamber which can be made vacuum air tight for cleaning the surface of the sample by use of plasma, 24 the conveyor for conveying the substrate to the respective treatment chambers, 25 the conveying chamber which can be made vacuum air tight and in which the conveyor 24 is set. 4d, 4e, 4f and 4g are gate valves which can take in or out the substrate and which can make the respective chambers vacuum air tight, and otherwise those attached with the same reference characters as in FIG. 1 show the same members. Further, to describe about the respective chambers, FIG. 4 and FIG. 5 show the light latent image forming part II and the Al selective deposition part III exploded of the apparatus in FIG. 1. The light latent image forming part shown in FIG. 4 can be also replaced with the drawing apparatus shown in FIG. 2. In FIG. 6 showing the plasma film forming chamber 21, 3d is the vacuum evacuation system, 5d the gas introducing inlet for introducing the deposition gas into the plasma film forming chamber 21, 6d the substrate holder for holding the substrate 1 set in the plasma film forming chamber 21, 26 the counter-electrode opposed to the substrate holder 6d and applied with high frequency power, 27 the insulator for electrical insulation of the counter-electrode 26 from the plasma film forming chamber 21, 28 the high frequency power source of 13.56 MHz and 350 W, 29 the matching box for taking matching between the substrate holder 6d and the high frequency power source 28 side. In FIG. 7 showing the etching chamber 22, 3e is the vacuum evacuation system, 30 the microwave plasma gas excitation device for generating the excitation etching gas to be fed to the etching chamber 22, 5e the gas introducing inlet for introducing the etching gas into the microwave gas excitation device 30, 6e the substrate holder for holding the substrate 1 placed in the etching chamber, 31 the transportation pipe for transporting the excited etching gas generated in the microwave gas excitation device 30 to the etching chamber 22. In FIG. 8 showing the cleaning chamber 23, 3f is the vacuum evacuation system, 5f the gas introducing inlet for introducing the cleaning gas into the vacuum vessel, 6f the substrate holder for holding the substrate 1 placed in the cleaning chamber, 32 the counter-electrode opposed to the substrate holder 6f, 33 the insulator for insulating direct currently the holder 6f, 28 the high frequency power source of 13.56 MHz and 200 W, 29 the matching box for taking matching between the sample holding stand side and the high frequency power source side.

By use of the apparatus as described above, a semiconductor device can be prepared without exposure to air, whereby no naturally oxidized film, etc. will be formed on the film surface to reduce contact resistance, improve the performances of the device, reduce the steps to great extent, reduce attachment of dust and also improve the yield.

EXAMPLE 1

As the first example, the process for forming an Al electrode pattern on the Si substrate having an $n^+$-a-Si film with a thickness of 2000 Å deposited thereon by means of the apparatus shown in FIG. 1 is explained.

The gate valve 4a was opened, the Si substrate previously cleaned placed in the loadlock chamber 2, the gate valve 4a closed, and vacuum evacuation effected by the vacuum evacuation system 3a to $10^{-7}$ Torr or lower. Previously, the latent image chamber 7 was internally vacuum evacuated by means of the vacuum evacuation system 3b to $10^{-8}$ Torr or lower, the gate valve 4b opened and the Si substrate mounted on the substrate holder 6b. Through the gas introducing inlet 5b, $O_2$ gas was introduced into the latent image chamber 7, and the vacuum evacuation system 3b controlled so that the inner pressure became 20 Torr. By use of KrF excimer laser as the light source 8, the laser beam with a wavelength of 248 nm oscillated by the laser was irradiated uniformly to the mask 10 for formation of electrode pattern by means of the illumination optical system 9, and the pattern image of the mask 15 was focused by the projection optical system 11 through the window 12 onto the $n^+$-a-Si film surface. For the material of the window, quartz was employed for permitting the laser beam with the wavelength of 248 nm to transmit through the window without absorption. At the $n^+$-a-Si film surface where the mask image was focused, $O_2$ and Si underwent photochemical reaction only at the portion irradiated with the light to form an $SiO_2$ film with a thickness of about 80 Å on the $n^+$-a-Si film surface by exposure for about 10 minutes. At the portion not irradiated with the light, no such reaction proceeded, and therefore a non-electron-donative surface with a desired shape was formed. That is, Si on the $n^+$-a-Si film surface changed to $SiO_2$, whereby a latent image (surface layer of non-electron-donative material) was formed. In other words, a negative pattern of the mask was formed on the $n^+$-a-Si film surface. After formation of the latent image, the introducing gas was stopped, and the system vacuum evacuated until the latent image chamber 7 became internally $10^{-7}$ Torr or lower. Previously, the Al selective deposition chamber 13 was evacuated to $10^{-7}$ Torr or lower by the vacuum evacuation system 3c, the gate valve 4c opened, the Si substrate 1 mounted on the substrate holder 6c previously heated by the heater 14 to 300° C., the gate valve 4c closed and the Al selective deposition chamber 13 internally evacuated by the vacuum evacuation system 3c to $10^{-8}$ Torr or lower. Through the first gasline of the gas mixer 15 was fed DMAH by use of $H_2$ as the carrier gas, and $H_2$ was fed through the second gasline. After the temperature of the Si substrate reached 300° C., DMAH and $H_2$ were introduced through the gas introducing inlet 5c into the selective deposition chamber 13, and the gas mixer 15 and the vacuum evacuation system 3c were controlled so that the total pressure within the Al selective deposition chamber 13 became 1.5 Torr, and the partial pressure of DMAH $1.5 \times 10^{-4}$ Torr. After deposition for 10 minutes, feeding of DMAH was stopped, heating of the heater 14 stopped and the Si substrate 1 cooled. Feeding of $H_2$ was stopped, and the Al selective deposition chamber 13 internally evacuated to $10^{-7}$ Torr or lower by the vacuum evacuation system 3c. The gate valves 4c and 4b were opened, the Si substrate 1 placed in the loadlock chamber 2, the gate valve 4b closed, $N_2$ gas introduced through the gas introducing inlet 5a to atmospheric pressure, the gate valve 4a opened and the Si substrate 1 taken out. As the result, on the surface applied with the latent image, nothing was detected even by surface analysis according to electrospectroscopy. On the other hand, on the a-Si film surface, no carbon was contained at all (detection limit or less), and an Al film of good quality having a resistivity of 2.7 $\mu\Omega \cdot cm$, an average wiring life of $1 \times 10^3$ to $10^4$ hours and a hillock density of 0 to $10/cm^2$, without generation of spike could be selectively deposited to form an electrode.

EXAMPLE 2

The present second example is to form an Al electrode pattern on the GaAs substrate by use of the drawing apparatus shown in FIG. 2 as the light latent image forming part of the apparatus shown in FIG. 1.

The gate valve 4a was opened, the GaAs substrate 1 previously cleaned placed in the loadlock chamber 2, the gate valve 4a closed, and vacuum evacuation effected by the vacuum evacuation system 3a to $10^{-7}$ Torr or lower. Previously, the latent chamber 7 was internally vacuum evacuated by the vacuum evacuation system 3b to $10^{-8}$ Torr or lower, the gate valve 4b opened and the GaAs substrate 1 mounted on the substrate holder 6b. Through the gas introducing inlet 5b was introduced $NO_2$ gas into the latent image chamber 7, and the vacuum evacuation system 3b controlled so that the inner pressure became 20 Torr. By use of an Ar laser as the light source 8, the laser beam with a wavelength 514 nm oscillated by the laser was modulated so as to form an electrode pattern by the optical modulator 17, scanned in one dimensional direction by the rotatory polyhedron 19, and focused onto the surface of the GaAs substrate 1 by means of collimater lens 18 and the f-θ lens 20. Also, the substrate holder 6g was selectively irradiated to the whole substrate surface with the beam by moving it in the direction perpendicular to the scanning direction of the laser beam. As the material of window, quartz was employed. At the surface of the GaAs substrate 1 irradiated with the laser beam $NO_2$ and Si underwent photochemical reaction only at the portion irradiated with the beam, whereby an oxide film layer with a thickness of about 100 Å was formed on the surface of the GaAs substrate 1 to form the surface layer of a non-electron-donative material which is the latent image layer. After formation of the latent image, the gas introduced was stopped, and vacuum evacuation effected until the latent image chamber 7 became internally $10^{-7}$ Torr or lower. Previously, the Al selective deposition chamber 13 was internally evacuated to $10^{-7}$ Torr or lower by the vacuum evacuation system 3c, the gate valve 4c opened, the GaAs substrate 1 mounted on the substrate holder 6c previously heated to 300° C. by the heater 14 within the Al selective deposition chamber 13, the gate valve 4c closed, and the Al selective deposition chamber 13 internally evacuated to $10^{-8}$ Torr or lower by the vacuum evacuation system 3c. Through the gasline, $H_2$ was fed, and after the temperature of the Si substrate reached 300° C., MMAH and $H_2$ were introduced through the gas introducing inlet 5c into the Al selective deposition chamber 13, and the gas mixer 15 and the vacuum evacuation system 3c were controlled so that the total pressure within the Al selective deposition chamber 13 became 1.5 Torr, and the partial pressure of MMAH $1.5 \times 10^{-4}$ Torr. After deposition for 10 minutes, feeding of MMAH was stopped, heating of the heater 14 stopped and the GaAs substrate 1 cooled. Feeding of $H_2$ was stopped and the Al selective deposition chamber 13 was internally evacuated to $10^{-7}$ Torr or lower by the vacuum evacuation system 3c. The gate valves 4c and 4b were opened, the GaAs substrate 1 placed in the loadlock chamber 2, the gate valve 4b closed, $N_2$ gas introduced through the gas introducing inlet 5a to atmospheric pressure, the gate valve 4a opened, and the GaAs substrate 1 taken out. As the result, an electrode of an Al film of good quality could be formed similarly as in Example 1.

EXAMPLE 3

The present third example is to form an Al electrode pattern on a quartz substrate having an a-SiN film with a thicknes of 100 Å by means of the apparatus of the drawing method showing in FIG. 2 as the light latent image forming part of the apparatus shown in FIG. 1.

The gate valve 4a was opened, the quartz substrate 1 previously cleaned placed in the loadlock chamber 2, the gate valve 4a closed, and vacuum evacuation effected to $10^{-7}$ Torr or lower according to the vacuum evacuation system 3a. Previously, the latent chamber 7 was internally vacuum evacuated by the vacuum evacuation system 3b to $10^{-8}$ Torr or lower. By use of an $NH_3$ laser excited with $CO_2$ laser as the light source, the laser beam oscillated by the laser was modulated so as to form an electrode pattern by the optical modulator 17, scanned in one-dimensional direction by the rotatory polyhedron 19, and focused onto the a-SiN film surface on the quartz substrate 1 by means of the collimater lens 18 and the f-θ lens 20. Also, the substrate holder 6g was selectively irradiated to the whole substrate surface with the beam by moving it in the direction perpendicular to the scanning direction of the laser beam. As the material of window, polyethylene was employed. At the a-SiN film surface of the quartz substrate 1 irradiated with the laser beam, the bond of Si—N was cleaved to reduce Si and form an oxide film layer with a thickness of about 100 Å on the SiN surface, thereby forming the surface layer of an electron-donative material which is the latent image layer. After formation of the latent image, the latent image chamber 7 was vacuum evacuated internally to $10^{-7}$ Torr or lower by means of the vacuum evacuation system 3c, the gate valve 4c opened, the quartz substrate 1 mounted on the substrate holder 6c previously heated to 300° C. by the heater 14 within the Al selective deposition chamber 13, the gate valve 4c closed, and the Al selective deposition chamber 13 internally evacuated to $10^{-8}$ Torr or lower by the vacuum evacuation system 3c. Through the first gasline of the gas mixer 15, MMAH was fed by use of $H_2$ as the carrier gas, and $H_2$ fed through the second gasline. After the temperature of the quartz substrate 1 reached 300° C., MMAH and $H_2$ were introduced through the gas introducing inlet 5c into the Al selective deposition chamber 13, and deposition effected for 10 minutes so that the total pressure within the Al selective deposition chamber 13 became 1.5 Torr and the partial pressure of MMAH $1.5 \times 10^{-4}$ Torr. Then, feeding of MMAH was stopped, heating of the heater 14 stopped and the GaAs substrate 1 cooled. Feeding of $H_2$ was stopped, and the Al selective deposition chamber 13 was internally evacuated to $10^{-7}$ Torr or lower by the vacuum evacuation system 3e. The gate valves 4c and 4b were opened, the GaAs substrate 1 placed in the loadlock chamber 2, the gate valve 4b closed, $N_2$ gas introduced through the gas introducing inlet 5a to atmospheric pressure, the gate valve 4a opened, and the quartz substrate 1 taken out. As the result, only on the electron-tolerable surface applied with a latent image, Al was selectively deposited to form an electrode of an Al film of good quality could be formed similarly as in Example 1.

EXAMPLE 4

The present fourth example is preparation of an amorphous silicon photosensor.

It is described by referring to the schematic illustration of the steps shown in FIGS. 9A to 9E. The gate valve 4a was opened, the quartz substrate 1 previously cleaned placed in the loadlock chamber 2, the gate valve 4a closed, and the chamber vacuum evacuated to $10^{-7}$ Torr or lower by means of the vacuum evacuation system 3a. Here, the conveying chamber 25 was constantly vacuum evacuated internally to $10^{-7}$ Torr or lower by means of the vacuum evacuation device (not shown). The gate valve 4g was opened, the quartz substrate 1 which is the sample taken out from the loadlock chamber 2 by the conveyor 9, the gate valve 4f connected to the cleaning chamber 23 previously vacuum evacuated through the conveying chamber to $10^{-7}$ Torr or lower by means of the vacuum evacuation system 3f was opened, the sample mounted on the substrate holder 6f, and the gate valve 4f closed. The cleaning chamber 23 was vacuum evacuated internally to $10^{-8}$ Torr or lower by the vacuum evacuation system 3f. Through the gas introducing inlet 5f was introduced the gas for cleaning of the surface of the quartz substrate 1, in this case of Ar at 50 SCCM into the cleaning chamber 23 and the vacuum evacuation device (not shown) was operated and controlled so that the pressure in the cleaning chamber 23 became 0.08 Torr. Next, a high frequency of 13.56 MHz and 100 W generated by the high frequency power source 28 was applied to the substrate holder 6f while controlling the matching box 29, thereby generating a plasma in the space between the substrate holder 6f and the counter-electrode 32. Since the sample holding stand 22 is insulated direct currently by the condenser (not shown) existing in the matching box 29, a negative direct current bias voltage of about 60 V is generated at the substrate holder 6f through the difference in mobility between electrons and ions, and Ar ions are accelerated by the voltage to be impinged against the surface of the quartz substrate 1 to sputter away physically the contaminants on the surface, whereby a cleaned surface can be obtained. The treatment time was made about 3 minutes. After completion of treatment, feeding of the gas was stopped, and the cleaning chamber 23 vacuum evacuated to a pressure of $10^{-7}$ Torr or lower. The gate valve 4f was opened, the quartz substrate 1 taken out by the conveyor 24, the gate valve 4f closed, and the cleaning chamber 23 vacuum evacuated so as to maintain internally a pressure of $10^{-7}$ Torr or lower.

Figure 9A:
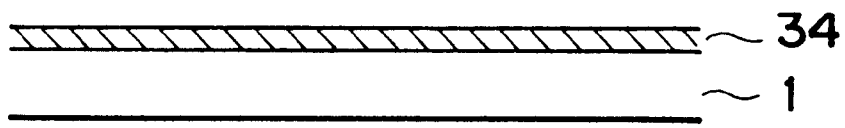
FIGS. 9A to 9E are schematic diagrams of steps showing the preparation procedures of the amorphous silicon photosensor prepared by use of the present invention.

Previously, by means of the vacuum evacuation device (not shown), the plasma film forming chamber 4 was internally vacuum evacuated to $10^{-7}$ Torr or lower. The gate valve 4d was opened, the quartz substrate 1 introduced into the plasma film forming chamber 21 by the conveyor 24 and mounted on the substrate holder 6 previously heated to 350° C. by the heater (not shown), and the gate valve 4d closed. The plasma film forming chamber 21 was vacuum evacuated internally to $10^{-7}$ Torr or lower by means of the vacuum evacuation system 3d, and heated until the temperature of the quartz substrate 1 became 350° C. Through the gas introducing inlet 5d was introduced $SiH_4$ at 13 SCCM, $H_2$ at 120 SCCM and $NH_3$ at 360 SCCM into the plasma film forming chamber 4, and the vacuum evacuation system 3d was operated and controlled so that the inner pressure in the plasma film forming chamber became 0.5 Torr. A high frequency wave of 13.56 MHz and 80 W generated by the high frequency power source 28 was applied to the counter-electrode 27 while controlling the matching box 29, thereby generating a plasma in the space between the substrate holder 6d and the counter-electrode 26 to effect plasma decomposition of the gas introduced and deposit the amorphous silicon nitride (a-SiH) film 34 to 1000 Å (FIG. 9A). After the film formation, the gas introduced was stopped, the plasma film forming chamber 21 was vacuum evacuated internally to $10^{-7}$ Torr or lower by the vacuum evacuation system 3d, the gate valve 4d opened, the quartz substrate 1 taken out by the conveyor 24, the gate valve 4d closed, and the plasma film forming chamber 21 vacuum evacuated so as to maintain internally a pressure of $10^{-7}$ Torr or lower.

Figure 9B:
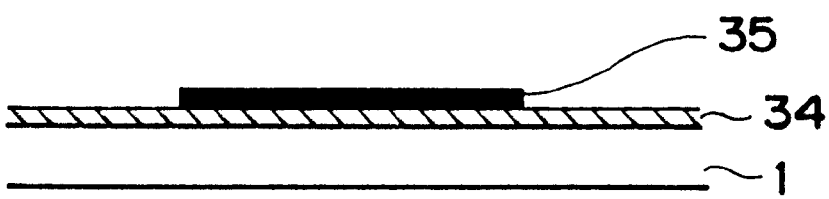

Next, the latent image chamber 7 was evacuated to $10^{-7}$ Torr or lower by the vacuum evacuation system 3b, the gate valve 4b opened, the quartz substrate 1 introduced into the latent image chamber 7 by the conveyor 24, mounted on the substrate holder 6b and the gate valve 4b closed. By means of the vacuum evacuation system 3b, the latent image chamber 7 was vacuum evacuated internally to $10^{-7}$ Torr or lower. According to the same method as in Example 3, a latent image was formed on the a-SiN film 34, the gate valve 4b opened, the quartz substrate 1 taken out by the conveyor 24, the gate valve 4b closed, and the latent image chamber 7 vacuum evacuated so as to maintain internally a pressure of $10^{-7}$ Torr or lower. Previously, the Al selective deposition chamber 13 was evacuated to $10^{-7}$ Torr or lower by the vacuum evacuation system 3c, the gate valve 4c opened, the quartz substrate 1 introduced by the conveyor 24 into the Al selective deposition chamber 13, mounted on the substrate holder 6c, and the gate valve 4c closed. By means of the vacuum evacuation system 3c, the Al selective deposition chamber 13 was vacuum evacuated internally to $10^{-8}$ Torr or lower. According to the same method as in Example 3, an Al lower electrode 35 with a thickness of 3000 Å was formed as shown in FIG. 9B. The gate valve 4c was opened, the quartz substrate 1 taken out by the conveyor 24, the gate valve 4c closed, and the Al selective deposition chamber 13 vacuum evacuated so as to maintain internally a pressure of $10^{-7}$ Torr or lower.

Figure 9C:
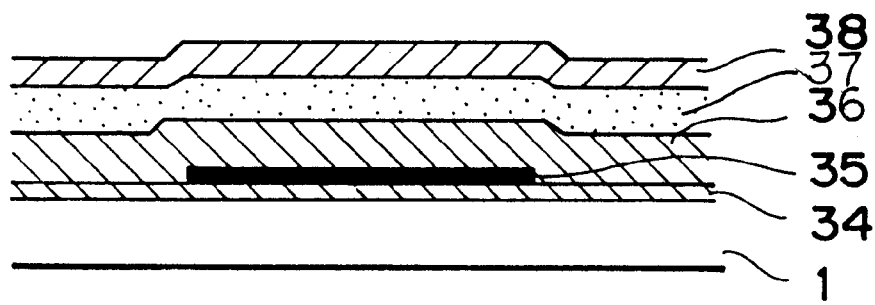

Next, the gate valve 4d was opened, the quartz substrate 1 introduced into the plasma film forming chamber 21 by the conveyor 24, mounted on the substrate holder 6d previously heated to 350° C. by the heater (not shown), and the gate valve 4d closed. By means of the vacuum evacuation system 3d, the plasma film forming chamber 21 was vacuum evacuated internally to $10^{-7}$ Torr or lower, and the quartz substrate heated to a temperature of 350° C. Through the gas introducing inlet 5d was introduced $SiH_4$ at 13 SCCM, $H_2$ at 120 SCCM and $NH_3$ at 360 SCCM into the plasma film forming chamber 4, and the vacuum evacuation system 3d was operated and controlled so that the pressure in the plasma film forming chamber became 0.5 Torr. While controlling the high frequency generated by the high frequency power source 28, it was applied to the counter-electrode 27 to generate a plasma in the space between the substrate holder 6d and the counter-electrode 26 and plasma decompose the gas introduced, thereby depositing the a-SiN film 36 to 3000 Å as shown in FIG. 9C. After the film formation, the gas introduced was stopped, and the plasma film forming chamber 21 was vacuum evacuated internally to $10^{-7}$ Torr by the vacuum evacuation system 3d. Next, the temperature of the substrate holder 6d was lowered to 250° C., to set the temperature of the quartz substrate 1 at 250° C. Through the gas introducing inlet 5d, $SiH_4$ was introduced at 100 SCCM, $H_2$ at 740 SCCM into the plasma film forming chamber 21, and the vacuum evacuation system 3d was operated and controlled so that the plasma film forming chamber became internally 0.5 Torr. A high frequency wave of 13.56 MHz and 100 W generated by the high frequency power source 28 was applied to the counter-electrode 26 while controlling the matching box 29 to effect plasma decomposition, thereby depositing the amorphous silicon (a-Si) film 37 to 15 $\mu$m as shown in FIG. 9C. After the film formation, the gas introduced was stopped, and the plasma film forming chamber 4 was vacuum evacuated internally to $10^{-7}$ Torr or lower. Next, through the gas introducing inlet 5d were introduced $SiH_4$ at 20 SCCM, $H_2$ at 80 SCCM and $PH_3$ at 400 SCCM into the plasma film forming chamber 21, and the vacuum evacuation system 3d was operated and controlled so that the pressure in the plasma film forming chamber became 0.5 Torr. A high frequency wave of 13.56 MHz and 300 W, generated by the high frequency power source 28 was applied to the counter-electrode 26 while controlling the matching box 29 to generate a plasma in the space between the substrate holder 6d and the counter-electrode 26 and effect plasma decomposition of the gas introduced, thereby depositing the $n^+$-a-Si film 38 to 2000 Å as shown in FIG. 9C. After the film formation, the gas introduced was stopped and the plasma film forming chamber 21 was vacuum evacuated internally to $10^{-7}$ Torr or lower by the vacuum evacuation system 3d.

Figure 9D:
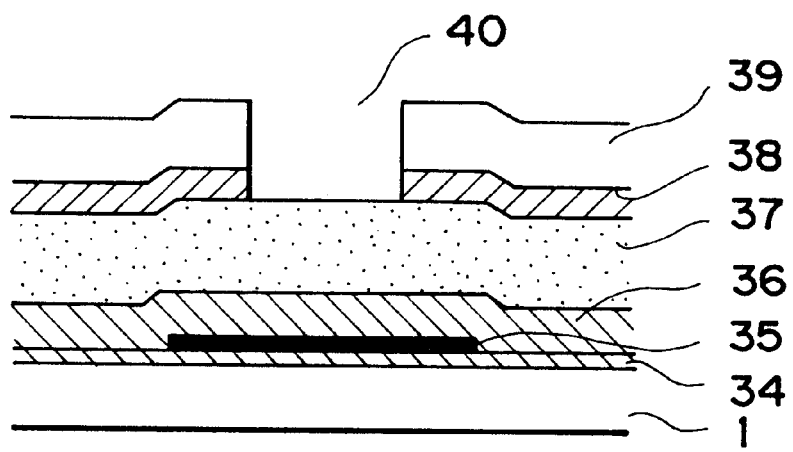

Next, the gate valve 4b was opened, the quartz substrate 1 introduced into the latent image chamber 7 by the conveyor 24, mounted on the substrate holder 6b, and the gate valve 4b closed. By means of the vacuum evacuation system 3b, the latent image chamber 7 was vacuum evacuated internally to $10^{-7}$ Torr or lower. According to the same method as in Example 1, a latent image was formed on the $n^+$-a-Si film, the gate valve 4b was opened, the quartz substrate 1 taken out by the conveyor 24, the gate valve 4b closed, and the latent image chamber 7 vacuum evacuated so as to maintain a pressure internally of $10^{-7}$ Torr or lower. And, previously the Al selective deposition chamber 13 was evacuated to $10^{-7}$ Torr or lower by the vacuum evacuation system 3, the gate valve 4c opened, the quartz substrate 1 introduced into the Al selective deposition chamber 13 by the conveyor 24, mounted on the substrate holder 6c, and the gate valve 4c closed. By means of the vacuum evacuation system 3c, the Al selective deposition chamber 13 was vacuum evacuated internally to $10^{-8}$ Torr or lower. According to the same method as in Example 1, the Al upper electrode 39 with a thickness of 6000 Å was formed as shown in FIG. 9D. The gate valve 4c was opened, the quartz substrate 1 taken out by the conveyor 24, the gate valve 4c closed, and the Al selective deposition chamber 13 vacuum evacuated so as to maintain internally a pressure of $10^{-7}$ Torr or lower.

Next, the etching chamber 22 was previously vacuum evacuated internally to $10^{-7}$ Torr or lower by the vacuum evacuation system 3e, the gate valve 4e opened, the quartz substrate 1 placed in the etching chamber 22 by the conveyor 24, vacuum evacuation effected to $10^{-7}$ Torr or lower, and as the etching gases, $NF_3$ was fed at 700 SCCM, $O_2$ at 200 SCCM and $H_2$ at 100 SCCM through the gas introducing inlet 5e into the microwave plasma gas excitation device 30, followed by operation and control of the vacuum evacuation system 3d so that the etching chamber 22 became internally 0.25 Torr. The microwave of 2.45 MHz and 700 W generated by the microwave generating device (not shown) was fed to the microwave plasma gas excitation device 30 to form the etching gas into plasma, only the neutral radicals excited by the plasma conveyed to the etching chamber 22 through the transportation pipe. With the Al upper electrode 39 as the mask, first the latent image of the oxide film formed on the $n^+$-a-Si film 38 was etched, then as the etching gas were flowed $NF_3$ at 800 SCCM and $O_2$ at 200 SCCM, and after completed, the etching gas was stopped, the etching chamber 22 vacuum evacuated internally to $10^{-7}$ Torr or lower by the vacuum evacuation system 3e, the gate valve 4e opened, the quartz substrate 1 taken out by the conveyor 24, the gate valve 4e closed, and the etching chamber 22 vacuum evacuated so as to maintain internally a pressure of $10^{-7}$ Torr or lower.

Figure 9E:
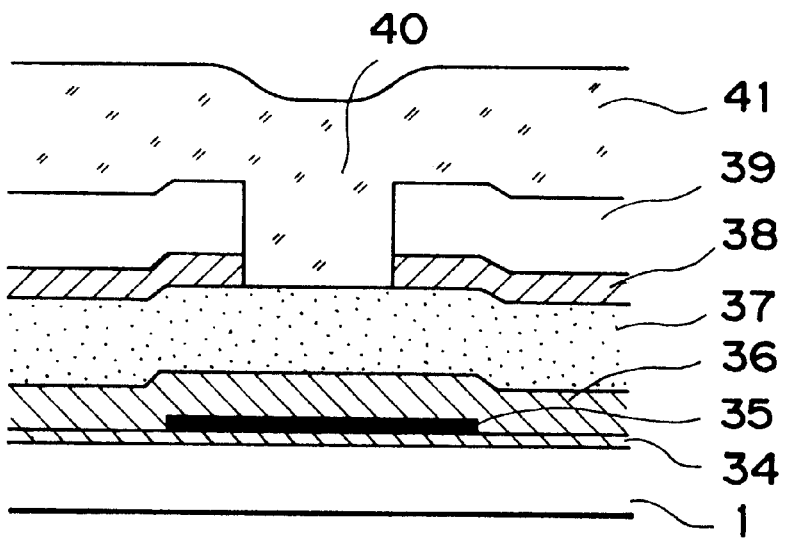

Next, the gate valve 4d was opened, the quartz substrate 1 introduced into the plasma film forming chamber 21 by the conveyor 24, mounted on the substrate holder 6d heated previously to 350° C. by the heater (not shown), and the gate valve 4d closed. Vacuum evacuation was effected by the vacuum evacuation system 3d until the plasma film forming chamber 21 became internally $10^{-7}$ Torr or lower, and the quartz substrate was heated to a temperature of 350° C. Through the gas introducing inlet 5d were introduced $SiH_4$ at 13 SCCM, $H_2$ at 120 SCCM and $NH_3$ at 360 SCCM into the plasma film forming chamber 4, and the vacuum evacuation system 3d was operated and controlled so that the pressure in the plasma film forming chamber became 0.5 Torr. A high frequency wave of 13.56 MHz and 80 W generated by the high frequency power source 28 was applied to the counter-electrode 27 while controlling the matching box 29 to generate a plasma in the space between the substrate holder 6d and the counter electrode 26, the gas introduced was subjected to plasma decomposition, thereby forming an amorphous silicon nitride (a-SiN) film 41 as the passivation film to 2 $\mu$m (FIG. 9E). After the film formation, the gas introduced was stopped, the plasma film forming chamber 21 was vacuum evacuated internally to $10^{-7}$ Torr or lower by the vacuum evacuation system 3d, the gate valve 4e opened, the quartz substrate 1 taken out by the conveyor 24, the gate valve 4d closed and the plasma film forming chamber 21 vacuum evacuated so as to maintain internally a pressure of $10^{-7}$ Torr or lower.

The gate valve 4g was opened, the quartz substrate placed in the loadlock chamber 2 by the conveyor 24, the gate valve 4g closed, $N_2$ gas introduced into the loadlock chamber 2 to return to atmospheric pressure, and the quartz substrate having an amorphous silicon photosensor prepared thereon was taken out. The performances of the amorphous silicon photosensor prepared in the present example were measured, and found to have low inner resistance, high sensitivity and little dark current.

According to the embodiments of the present invention as described above, good metal electrode or metal wiring can be formed according to an extremely simple process. Besides since the electron donative and non-electron-donative surfaces are formed by utilizing photoreaction, there is little damage in the surface modification step.

More specifically, the present embodiments utilizing photoreaction are more preferable. It is because the energy amount required for the reaction can be 10 eV, and therefore undesirable defect levels, etc. will generally not be formed. Therefore, as can be understood by measurement of the photoelectric converting characteristics, etc. of the photoelectric converting device, etc., it is an excellent method.

As described above, according to the present invention, an electrode or wiring can be formed by forming light latent image film to vary the electron donative characteristics of the surface. Therefore, since resist is not employed, the steps can be simplified, generation of dust alleviated to improve the yield, and a metal film of good quality can be formed. Further, a consistent process of the semiconductor device in vacuum is rendered possible, whereby a semiconductor device of high performance can be prepared because of no contact with the air, and also reliability of the device can be improved without generation of after-corrosion because of no presence of etching step.

What is claimed is:

1. A process for preparing a semiconductor device, comprising the step of selectively depositing a metal on an electron-donative surface provided by surface-modifying a desired portion of a surface of a substrate, wherein the surface modification is performed by a photochemical reaction generated by light irradiation with laser beam having an energy capable of breaking a bond between nitrogen and silicon atoms, thereby reducing silicon nitride to a silicon film to form the electron-donative surface, and the metal is selectively deposited on the formed electron-donative surface in an atmosphere comprising an organometallic compound and hydrogen gas.

2. A process for preparing a semiconductor device according to claim 1, wherein said surface modification step is carried out under a pressure of $10^{-8}$ Torr or less.

3. A process for preparing a semiconductor device according to claim 1, wherein the photochemical reaction is a reduction reaction.

* * * * *

UNITED STATES PATENT AND TRADEMARK OFFICE
CERTIFICATE OF CORRECTION

PATENT NO.    : 6,303,499 B1
DATED         : October 16, 2001
INVENTOR(S)   : Yasue Sato It is certified that error appears in the above-identified patent and that said Letters Patent is hereby corrected as shown below:

Column 1,
Line 50, "the" should be deleted.

Column 2,
Line 44, "the" should read -- a --;
Line 45, "a" should read -- the --.

Column 3,
Line 6-7, "selectivity" should read -- selectively --.

Column 4,
Line 54, "with" should read -- within --.

Signed and Sealed this

Nineteenth Day of March, 2002

Attest:

JAMES E. ROGAN
Director of the United States Patent and Trademark Office

Attesting Officer